United States Patent
Kaneda et al.

(10) Patent No.: US 7,795,999 B2
(45) Date of Patent: Sep. 14, 2010

(54) FILTER HAVING MULTIPLE SURFACE ACOUSTIC WAVE FILTERS CONNECTED IN PARALLEL

(75) Inventors: Yasufumi Kaneda, Yokohama (JP); Osamu Kawachi, Yokohama (JP); Seiichi Mitobe, Yokohama (JP); Kouta Ookubo, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 217 days.

(21) Appl. No.: 11/878,747

(22) Filed: Jul. 26, 2007

(65) Prior Publication Data

US 2008/0024246 A1   Jan. 31, 2008

(30) Foreign Application Priority Data

Jul. 27, 2006   (JP) .............................. 2006-204139

(51) Int. Cl.
H03H 9/64   (2006.01)
(52) U.S. Cl. ....................... 333/193; 333/195
(58) Field of Classification Search ................. 333/193, 333/195
See application file for complete search history.

(56) References Cited

U.S. PATENT DOCUMENTS 5,666,092 A     9/1997  Yamamoto et al.
6,420,946 B1 *  7/2002  Bauer et al. .................. 333/193
6,731,188 B2 *  5/2004  Sawada et al. ............... 333/193
6,900,577 B2 *  5/2005  Takamine ................ 310/313 D
6,989,724 B2 *  1/2006  Watanabe et al. ........... 333/133
2002/0000898 A1  1/2002  Takamine
2002/0163403 A1  11/2002 Sawada et al.
2003/0169129 A1  9/2003  Takamine

FOREIGN PATENT DOCUMENTS

| EP | 0 600 705 A1 | 6/1994 |
| EP | 0 936 735 A2 | 8/1999 |
| EP | 0 936 735 A3 | 1/2001 |
| EP | 1 158 672 A2 | 11/2001 |
| EP | 1 249 933 A2 | 10/2002 |
| EP | 1 158 672 A3 | 8/2005 |
| JP | 62-261211 A | 11/1987 |
| JP | 6-334476 A | 12/1994 |
| JP | 2002-84163 A | 3/2002 |
| JP | 2003-249842 A | 9/2003 |
| KR | 10-2002-0075306 A | 10/2002 |

* cited by examiner

*Primary Examiner*—Robert Pascal
*Assistant Examiner*—Alan Wong
(74) *Attorney, Agent, or Firm*—Arent Fox LLP

(57) ABSTRACT

A filter includes a first filter that is connected between an input node and an output node and is a surface acoustic wave filter, and a second filter that is provided between the input node and the output node and is connected in parallel with the first filter. The first filter has a total number N1 of pairs of electrode fingers of interdigital transducers and the second filter having a total number N2 of pairs of electrode fingers of interdigital transducers, in which N1 is greater than N2.

6 Claims, 5 Drawing Sheets

FILTER HAVING MULTIPLE SURFACE ACOUSTIC WAVE FILTERS CONNECTED IN PARALLEL

BACKGROUND OF THE INVENTION

1. Field of the Invention

The present invention relates to filters, and more particularly, to a filter having multiple surface acoustic wave filters connected in parallel.

2. Description of the Related Art

Recently, portable phones and portable information terminals have been widely used due to the development of mobile communication systems. For example, the portable phone terminals use a high frequency range of 800 MHz to 1.0 GHz or 1.5 GHz to 2.0 GHz. Filters employed in the mobile communication systems are required to have a low insertion loss in the pass band and a great attenuation in frequencies outside of the pass band. The transmission filter used in the portable phone terminals is required to have high attenuation in the reception band, and the reception filter used therein is required to have high attenuation in the transmission band. These filters may be formed by surface acoustic wave filters. Japanese Patent Application No. 2003-249842 discloses a surface acoustic wave filter having double-mode filters that are connected in parallel for the purpose of improving the insertion loss in the pass band.

The parallel connection of surface acoustic wave filters reduces the insertion loss in the pass band, but has a difficulty in increasing the attenuation in frequencies outside of the pass band. It may be considered to optimize the film thickness of electrodes of the surface acoustic wave devices connected in parallel to form the filter in order to improve the attenuation. However, the impedance of the filter may deviate from the target value and degrade the insertion loss in the pass band. As described above, it is difficult to realize filters having both a low insertion loss and a high attenuation.

SUMMARY OF THE INVENTION

The present invention has been made in view of the above-mentioned circumstances and provides a filter having surface acoustic wave filters connected in parallel and having a reduced insertion loss in the pass band and an increased attenuation outside of the pass band.

According to an aspect of the present invention, there is provided a filter including: a first filter that is connected between an input node and an output node and is a surface acoustic wave filter; and a second filter that is provided between the input node and the output node and is connected in parallel with the first filter, the first filter having a total number N1 of pairs of electrode fingers of interdigital transducers and the second filter having a total number N2 of pairs of electrode fingers of interdigital transducers, N1 being greater than N2.

According to another aspect of the present invention, there is provided a filter including: a first filter that is connected between an input node and an output node and is a surface acoustic wave filter; and a second filter that is provided between the input node and the output node and is connected in parallel with the first filter, the first filter having a product NAp1 of a total number N1 of pairs of electrode fingers of interdigital transducers and an aperture length, the second filter having a product NAp2 of a total number N2 of pairs of electrode fingers of interdigital transducers and an aperture length, NAp2<NAp1.

BRIEF DESCRIPTION OF THE DRAWINGS

The other objects, features and advantages of the present invention will become more apparent from the following detailed description when read in conjunction with the accompanying drawings, in which.

DESCRIPTION OF THE PREFERRED EMBODIMENTS

Figure 1:
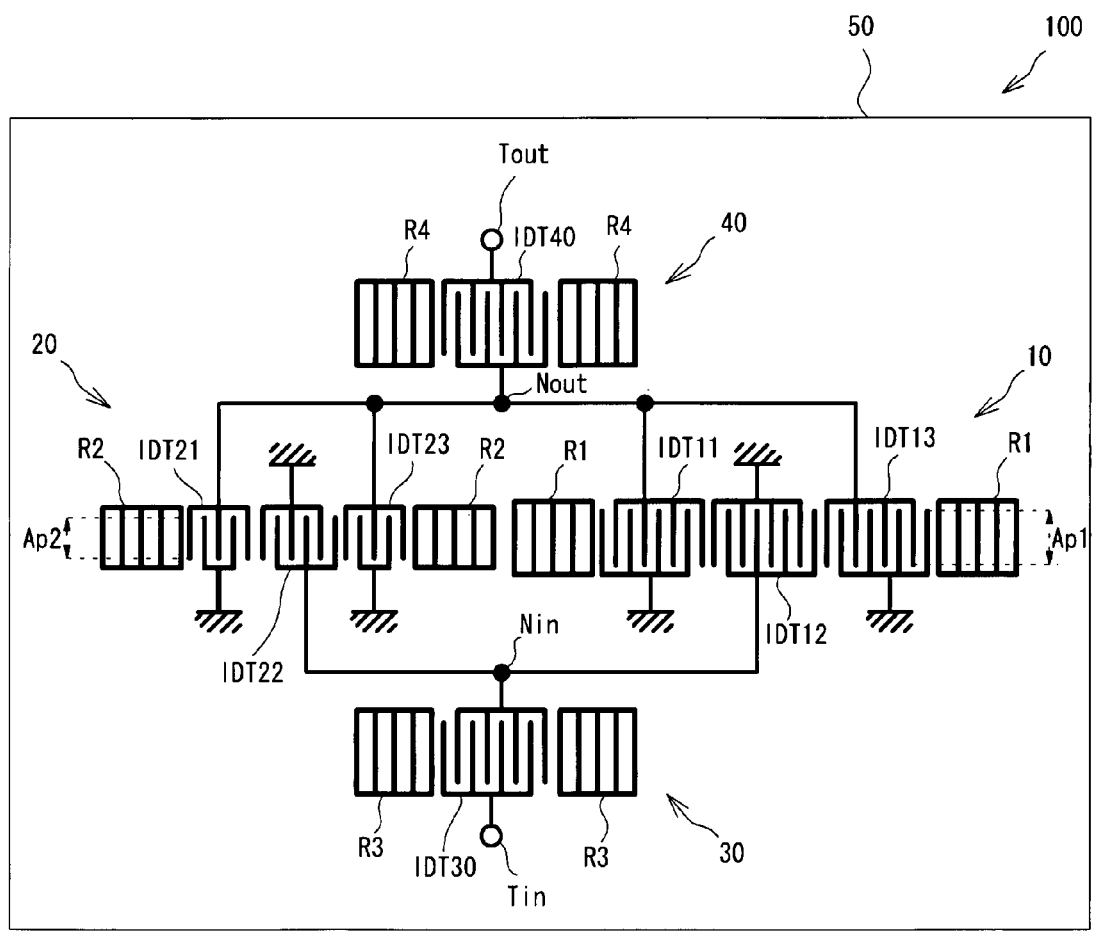
FIG. 1 schematically shows a filter in accordance with a first embodiment of the present invention.
Figure 2:
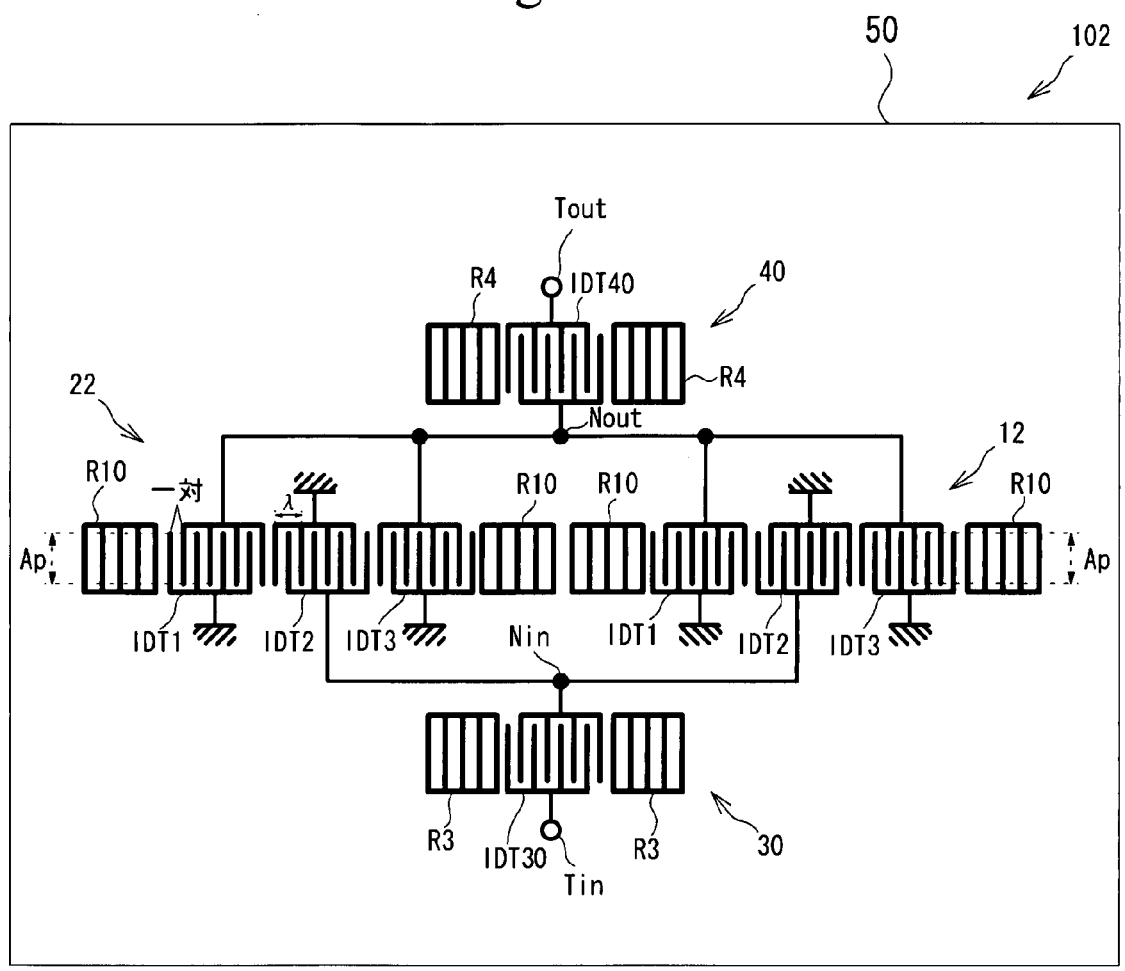
FIG. 2 schematically shows a filter of a comparative example.

FIG. 1 schematically shows a filter in accordance with a first embodiment of the present invention, and FIG. 2 schematically shows a comparative example of filter. A filter 100 shown in FIG. 1 has a piezoelectric substrate 50 made of, for example, $LiNbO_3$ or $LiTaO_3$ on which interdigital transducers (IDTs) and reflectors are formed. The IDTs and reflectors may be metal films of, for example, aluminum. The filter 100 includes a first filter 10, a second filter 20, and resonators 30 and 40. The first filter 10 is connected between an input node Nin and an output node Nout. The second filter 20 is connected between the input node Nin and the output node Nout and is connected in parallel with the first filter 10. The resonator 30 is connected in series between the input node Nin and the input terminal Tin. The resonator 40 is connected in series between the output terminal Tout and the output node Nout. The filter 100 has an input terminal Tin and an output terminal Tout, which are unbalanced input and output terminals, respectively. The first embodiment thus structured differs from the comparative example in the first filter 10 and the second filter 20, as will be described in detail later.

The first filter 10 is a double-mode filter in which three IDTs 11, 12 and 13 are provided between two reflectors R1. The IDTs 11 and 13 function as output IDTs connected to the output node Nout, and the IDT 12 functions as an input IDT connected to the input node Nin. The second filter 20 includes IDTs 21, 22 and 23 provided between two reflectors R2. The IDTs 21 and 23 are connected to the output node Nout, and the IDT 22 is connected to the input node Nin. That is, in each of the filters 10 and 20, one of the three IDTs that may be an input IDT or an output IDT is provided between the two remaining IDTs that may be output IDTs or input IDTs. The resonator 30 has an interdigital transducer IDT30 provided between two reflectors R3, and the resonator 40 has an interdigital transducer IDT40 provided between two reflectors R4.

Referring to FIG. 2, a filter 102 of the comparative example includes a first filter 12, a second filter 22, a resonator 30 and another resonator 40. The filter 102 differs from the filter 100 in that the first filter 12 and the second filter 22 have an identical structure. More specifically, three IDTs 1, 2 and 3 are provided between two reflectors R10. The IDTs 1 and 3 are connected to the output node Nout, and the IDT 2 is connected to the input node Nin.

Next, a description will be given of the structures of the first filter 10 and the second filter 20 employed in the first embodiment. Now, the following are defined with reference to FIG. 2. The number of pairs is defined so that one pair is composed of a single input/output electrode finger of an input/output electrode (connected to an input or output node) of an IDT and a single ground electrode finger of a ground electrode (connected to ground) of the IDT. An electrode wavelength λ is the length equal to the product of the electrode pitch and 2. An aperture length Ap of comb-shaped electrodes is the length of an overlapping section defined by an input/output electrode finger and an adjacent ground electrode finger arranged in an interleaving format.

Turning to FIG. 1 again, the first filter 10 in the first embodiment has an aperture length Ap1 of 93 µm. The numbers of pairs of the IDTs 11, 12 and 13 are equal to 11.5, 35.5 and 32.5, respectively, and the electrode wavelengths thereof are approximately equal to 2.3 µm, 2.33 µm and 2.33 µm, respectively. The second filter 20 has an aperture length Ap2 of 71 µm. The numbers of pairs of the IDTs 21, 22 and 23 are equal to 6.5, 11.5 and 5.5, respectively, and the electrode wavelengths thereof are approximately equal to 2.32 µm, 2.3 µm and 2.34 µm, respectively. The resonator 30 has an aperture length of 67 µm, a number of pairs of 83, and an electrode wavelength of approximately 2.28 µm. The resonator 40 has an aperture length of 59 µm, a number of pairs of 118, and an electrode wavelength of approximately 2.28 µm.

Referring to FIG. 2, each of the first filter 12 and the second filter 22 of the comparative example has an aperture length Ap of 80 µm. The IDTs 1, 2 and 3 have numbers of pairs of 14, 44 and 14, respectively, and electrode wavelengths of approximately 2.3 µm, 2.33 µm and 2.3 µm, respectively. Each of the resonators 30 and 40 has an aperture length of 80 µm, a number of pairs of 200, and an electrode wavelength of approximately 2.29 µm, respectively.

The total N1 of the numbers of pairs of the IDTs 11, 12 and 13 of the first filter 10 employed in the first embodiment is equal to 79.5, and the aperture length Ap1 thereof is equal to 93 µm. The total N2 of the number of pairs of the second filter 20 is equal to 23.5 and the aperture length Ap2 thereof is equal to 71 µm. Thus, $N2/N1=0.3$, and $Ap2/Ap1=0.76$.

Assuming that NAp1 is the product of the total N1 of the numbers of pairs and the aperture length Ap1 in the first filter 10, and NAp2 is the product of the total N2 of the number of pairs and the aperture length Ap2 in the second filter 20, the following is obtained:

$NAp2/NAp1=0.23$.

The number of pairs and the aperture lengths of the filter 100 of the first embodiment and the filter 102 of the comparative example are designed to have an identical impedance between the input node Nin and the output node Nout for the purpose of realizing an identical insertion loss. The first filter 10 of the first embodiment has an impedance of approximately 60Ω, and the second filter 20 has an impedance of approximately 300Ω. The first filter 12 and the second filter 22 of the comparative example have an identical impedance of approximately 100Ω. Thus, both the first embodiment and the comparative example have an impedance of approximately 50Ω between the input node Nin and the output node Nout.

Figure 3:
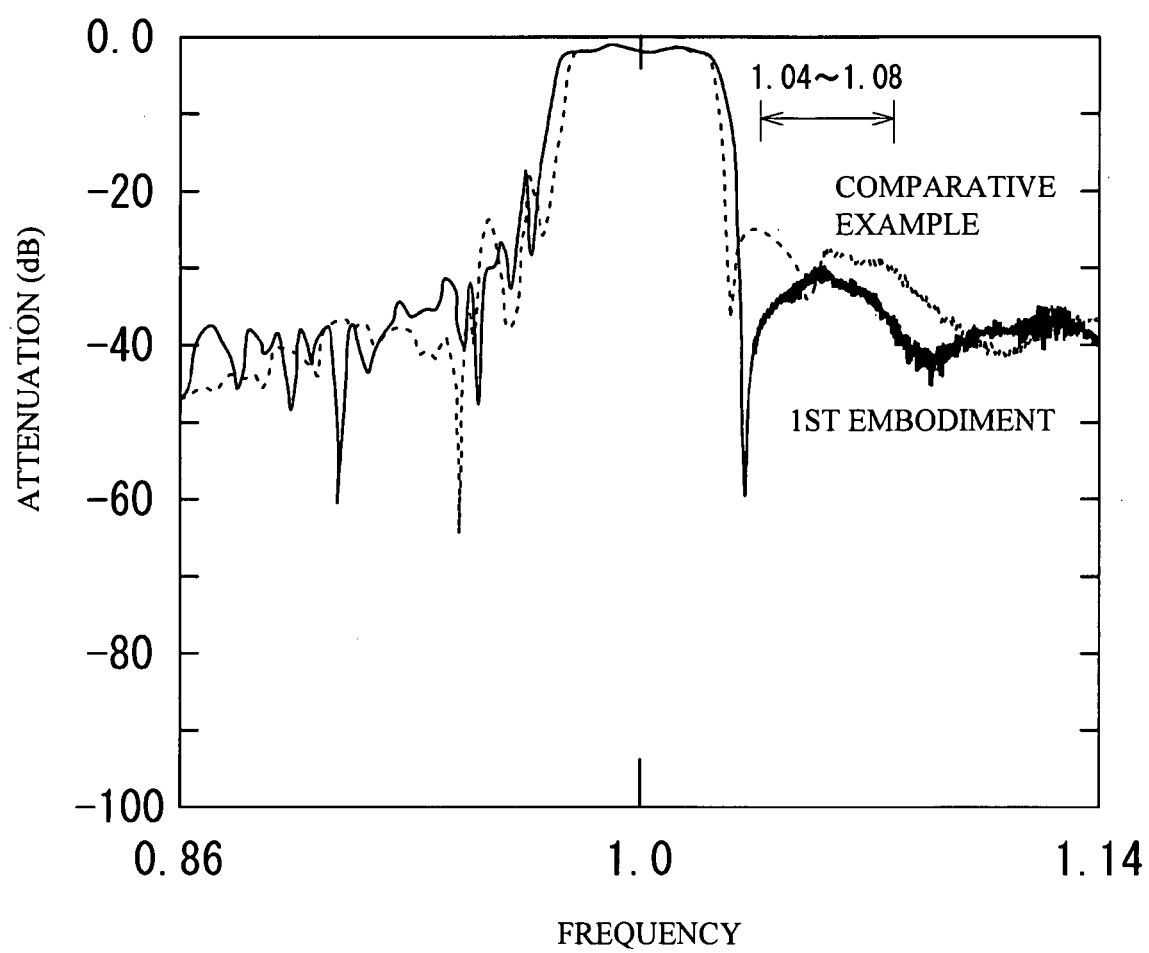
FIG. 3 is a graph of bandpass characteristics of the first embodiment and the comparative example.

FIG. 3 is a graph of bandpass characteristics of the first embodiment and the comparative example, in which the frequency is normalized by the center frequency of the pass band. In FIG. 3, a solid line and a broken line indicate the first embodiment and the comparative example, respectively. The first embodiment and the comparative example have almost the same insertion loss in the pass band. This is because the impedance made by the first filter 10 and the second filter 20 connected in parallel in the first embodiment is set approximately equal to the impedance made by the first filter 12 and the second filter 22 connected in parallel in the comparative example. In contrast, the first embodiment has a greater attenuation than that of the comparative example in a range of 1.04 to 1.08 at the high-frequency side of the pass band. The above range may correspond to the reception band assuming that the pass bands of the first embodiment and the comparative example are used for transmission. The first embodiment is capable of realizing reduced insertion loss due to the parallel connection of the surface acoustic wave filters and increased attenuation at frequencies outside of the pass band.

Figure 4:
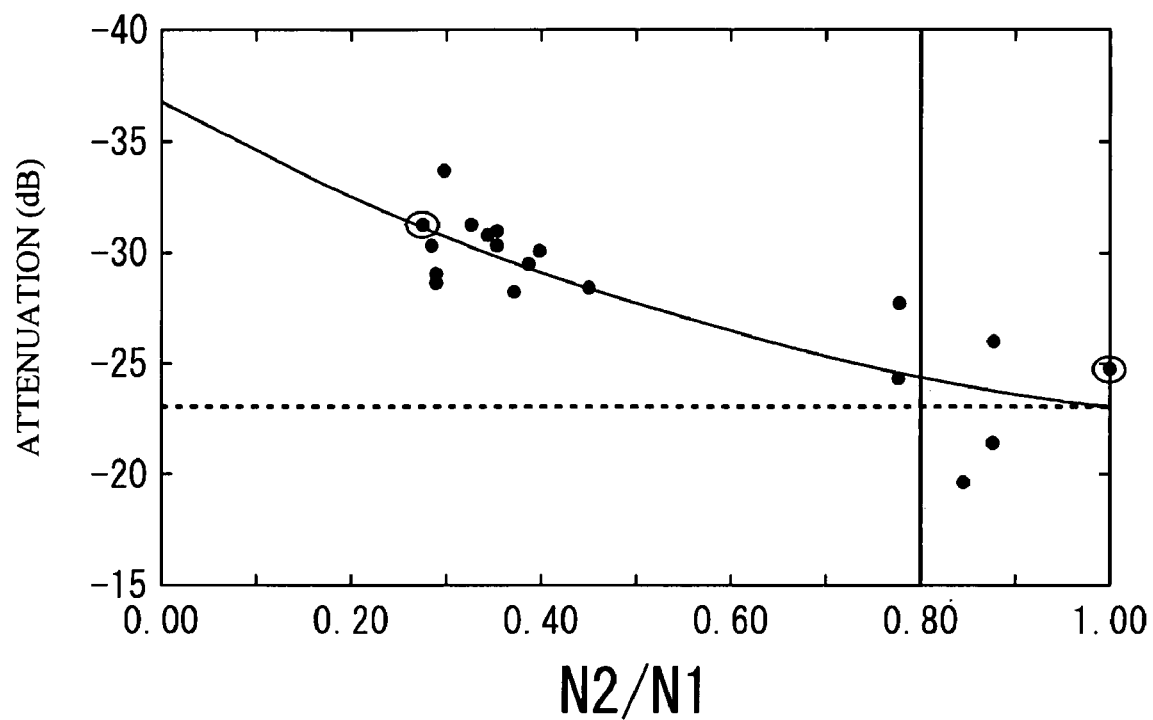
FIG. 4 is a graph of results of calculation of attenuation at the high-frequency side of the pass bands of the first embodiment and the comparative example as a function of N2/N1.
Figure 5:
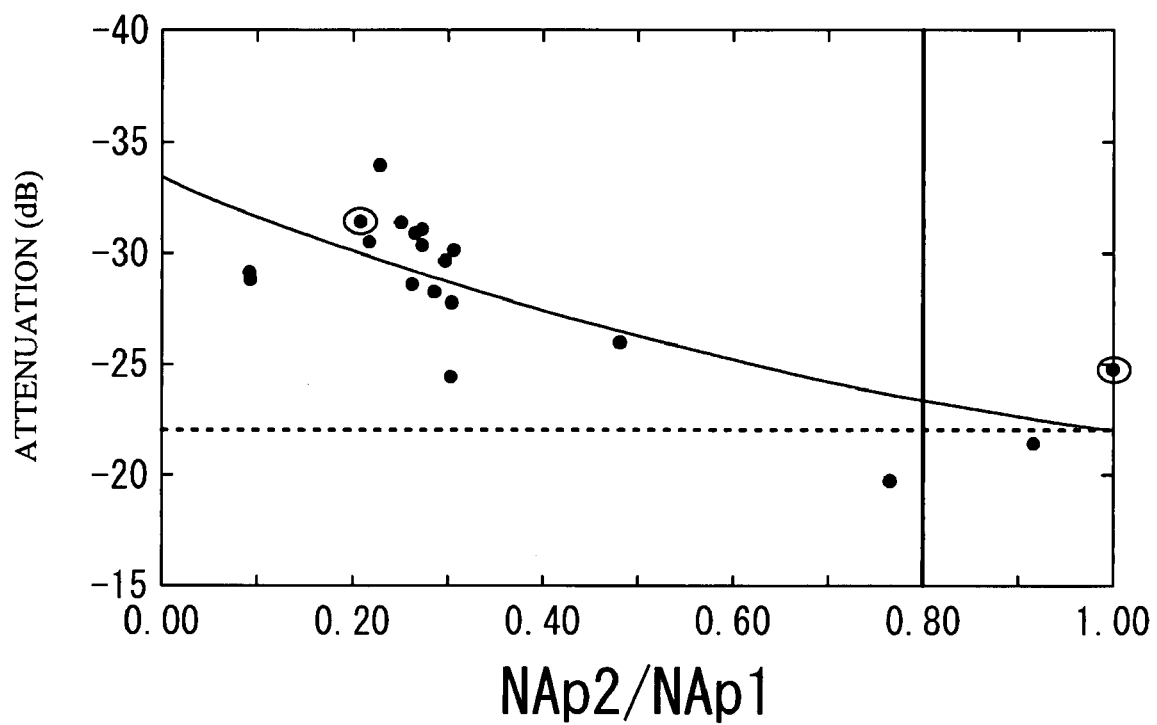
FIG. 5 is a graph of results of calculation of attenuation at the high-frequency side of the pass bands of the first embodiment and the comparative example as a function of NAp2/NAp1.

The inventors calculated the amounts of attenuation in the range of 1.04 to 1.08 at the high-frequency side of the pass band by changing the number of pairs and the aperture lengths of the first filter 10 and the second filter 20, and tried to find out the worst amounts of attenuation in the above range. FIGS. 4 and 5 show the results of calculation performed under the following conditions. The total number N1 of pairs of the first filter 10 was changed within the range of 48 to 80, and the total number N2 of pairs of the second filter 20 was changed within the range of 18 to 73. The aperture length Ap1 of the first filter 10 wash changed within the range of 27λ to 52λ, and the aperture length Ap2 of the second filter 20 was changed within the range of 17λ to 36λ. The electrode wavelength λ of the first filter 10 and the second filter 20 was changed within the range of 2 µm to 2.5 µm. The horizontal axis of FIG. 4 denotes N2/N1. and the vertical axis denotes attenuation (dB). The horizontal axis of FIG. 5 denotes NAp2/NAp1, and the vertical axis denotes attenuation (dB). In FIGS. 4 and 5, dots are the results of calculation, and curved lines are approximate lines. Dots surrounded by circles located at positions where N2/N1 and NAp2/NAp1 are equal to 1.00 relate to the comparative example, and dots surrounded by circles located at positions where N2/N1 and NAp2/NAp1 are located close to 0.2 to 0.3 relate to the first embodiment. It can be seen from FIG. 4 that the attenuation is increased when N2/N1<1 and is abruptly increased when N2/N1≦0.8. It can be seen from FIG. 5 that the attenuation is increased when NAp2/NAp1<1 and is abruptly increased when NAp2/NAp1≦0.8.

As shown in FIGS. 4 and 5, the out-of-pass-band attenuation at the high-frequency side of the pass band can be increased by N2<N1 or NAp2<NAp1. Preferably, N2/N1≦0.8 or NAp2/NAp1≦0.8. More preferably, N2/N1≦0.5 or NAp2/NAp1≦0.5. It is preferable that a resonator is connected to at least one of the input node Nin and the output node Nout in series or parallel. It is thus possible to have an attenuation pole at the high-frequency side of the pass band. When a resonator is connected to the input node Nin in series, this resonator is provided between the input node Nin and the input terminal Tin. When a resonator is connected to the input node Nin in parallel, this resonator is provided between the input node Nin and ground. When a resonator is connected to the output node Nout in series, this resonator is provided between the output node Nout and the output terminal Tout. When a resonator is connected to the output node Nout in parallel, this resonator is provided between the output node Nout and ground.

The present invention is not limited to the specifically described embodiments, but may include other embodiments and variations without departing from the scope of the present invention. For example, a second embodiment is available by changing the double-mode filters employed in the first embodiment to another type of surface acoustic wave filter.

The present invention is based on Japanese Patent Application No. 2006-204139 filed on Jul. 27, 2006, the entire disclosure of which is hereby incorporated by reference.

What is claimed is:

1. A filter comprising:
   a first filter that is connected between an input node and an output node and is a surface acoustic wave filter; and
   a second filter that is provided between the input node and the output node and is connected in parallel with the first filter,
   the first filter having a total number N1 of pairs of electrode fingers of interdigital transducers and the second filter having a total number N2 of pairs of electrode fingers of interdigital transducers, and $N2/N1 \leq 0.5$, wherein the first and second filters are double-mode filters.

2. The filter as claimed in claim 1, further comprising a resonator connected to at least one of the input node and the output node in series or parallel.

3. The filter as claimed in claim 1, wherein each of the first and second filters has two interdigital transducers that function as input or output interdigital transducers and another transducer that functions as an output or input interdigital transducer and is interposed between said two interdigital transducers.

4. A filter comprising:
   a first filter that is connected between an input node and an output node and is a surface acoustic wave filter; and
   a second filter that is provided between the input node and the output node and is connected in parallel with the first filter,
   the first filter having a product NAp1 of a total number N1 of pairs of electrode fingers of interdigital transducers and an aperture length Ap1,
   the second filter having a product NAp2 of a total number N2 of pairs of electrode fingers of interdigital transducers and an aperture length Ap2, and $NAp2/NAp1 \leq 0.5$, wherein the first and second filters are double-mode filters.

5. The filter as claimed in claim 4, further comprising a resonator connected to at least one of the input node and the output node in series or parallel.

6. The filter as claimed in claim 4, wherein each of the first and second filters has two interdigital transducers that function as input or output interdigital transducers and another transducer that functions as an output or input interdigital transducer and is interposed between said two interdigital transducers.

* * * * *